US006601453B2

(12) United States Patent  (10) Patent No.: US 6,601,453 B2
Miyazaki et al.  (45) Date of Patent: Aug. 5, 2003

(54) PRESSURE DETECTING APPARATUS

(75) Inventors: Atsushi Miyazaki, Mito (JP);
Katsuhiko Kikuchi, Hitachinaka (JP);
Hiromichi Ebine, Omiya-machi (JP);
Satoshi Shimada, Hitachi (JP);
Masahide Hayashi, MIto (JP)

(73) Assignees: Hitachi, Ltd., Tokyo (JP); Hitachi Car Engineering Co., Ltd., Ibaraki (JP)

( * ) Notice: Subject to any disclaimer, the term of this patent is extended or adjusted under 35 U.S.C. 154(b) by 0 days.

(21) Appl. No.: 10/101,526

(22) Filed: Mar. 20, 2002

(65) Prior Publication Data

US 2003/0094050 A1 May 22, 2003

(30) Foreign Application Priority Data

Nov. 16, 2001 (JP) .......................................... 2001-351539

(51) Int. Cl.⁷ ................................................. G01L 9/16
(52) U.S. Cl. ............................. 73/754; 73/753; 73/756
(58) Field of Search ........................... 73/724, 754, 756, 73/727–729

(56) References Cited

U.S. PATENT DOCUMENTS 5,386,730 A  *  2/1995  Ikeda et al. .................... 73/706
5,948,991 A     9/1999  Nomura et al.
6,050,146 A  *  4/2000  Nakamura et al. ............. 73/725

FOREIGN PATENT DOCUMENTS

EP   0877240 A2   11/1998
JP   10-170380    6/1998

* cited by examiner

Primary Examiner—Hezron Williams
Assistant Examiner—Jermaine Jenkins
(74) Attorney, Agent, or Firm—Crowell & Moring LLP

(57) ABSTRACT

The present invention provides a pressure detector capable of easily responding to changes in specification. The pressure detector has a sensor unit for detecting pressure and electronic parts for reducing electrical disturbance which are electrically joined to an exposed part of lead material of an opening of an external case. Thermoset resin is injected and set in the opening to obtain fixed members. An external electronic part for compensating for transient voltage resistance and electromagnetic failure resistance of a single one-chip semiconductor sensor can be mounted, and cost can be reduced by miniaturization, light weight, and reduction in man-hours required for assembly.

14 Claims, 3 Drawing Sheets

PRESSURE DETECTING APPARATUS

BACKGROUND OF THE INVENTION

The present invention relates to a pressure detecting apparatus and more particularly to a pressure detecting apparatus mounting electronic parts for reducing electric disturbance.

A conventional pressure detecting apparatus, for example, as described in Japanese Application Patent Laid-open Publication no. Hei 10-170380, is a 2-chip sensor unit composed of a semiconductor sensor chip for converting a physical quantity to an electric signal and a semiconductor circuit chip for carrying out operations for a sensor output signal and obtaining a detection signal. The 2-chip constitution is a structure that the aforementioned semiconductor circuit chip is arranged on the lead frame, sealed with resin, thereby constitutes a package partially having a cavity, and the sensor unit that the semiconductor sensor chip is arranged in the cavity and electrically connected is arranged in the concave opening of the external case which is formed integratedly with the lead material having the concave opening and partially the connector terminal which is partially exposed into the concave opening, and the lead material is electrically joined with the lead frame, and then the package is closed with the cover.

However, in a conventional sensor unit of 2-chip constitution, when the user-required specification for transient voltage resistance and electromagnetic resistance is graded up more severely, a conventional semiconductor chip may not meet with the specification. If this occurs, it is necessary to re-design a customized chip and respond to it and a problem arises that many man-hours and expenses are required.

SUMMARY OF THE INVENTION

The present invention is intended to provide a pressure detecting apparatus capable of easily responding to specification changes.

(1) To accomplish the above object, the present invention has a lead material partially having a connector terminal for electrical connection with the outside, an external case partially having an opening which is formed integratedly with the lead material, a sensor unit composed of a semiconductor sensor for converting pressure to an electric signal, a signal processing circuit, an output terminal for outputting the processed signal, and a chip case partially having an opening as main component parts, and an electronic part for reducing electric disturbance, and a part of the lead material is exposed into the opening of the external case, and the sensor unit and electronic part are arranged in the opening of the external case, and the lead material, electronic part, and terminal of the sensor unit are electrically connected to each other in the opening of the external case.

By use of this constitution, the present invention can easily respond to specification changes.

(2) In (1) mentioned above, it is preferable that the external case is provided with a pressure introduction hole interconnecting with the opening of the external case, and the opening of the sensor unit and the opening of the external case are respectively provided with fitting parts, and the sensor unit and external case are fit into each other so that the semiconductor sensor of the sensor unit and the air introduction hole of the external case are interconnected with each other, and the sensor unit, electronic part, and exposed part of the lead material which are arranged in the opening of the external case are covered overall or partially with resin injected into the opening of the external case and integratedly fixed with injected resin, and the fitting part of the sensor unit and external case is sealed airtightly.

(3) To accomplish the above object, the present invention has a lead material partially having a connector terminal for electrical connection with the outside, an external case partially having an opening and a pressure introduction hole interconnecting with the opening which is formed integratedly with the lead material, and a sensor unit composed of a semiconductor sensor for converting pressure to an electric signal, a signal processing circuit, an output terminal for outputting the processed signal, and a chip case partially having an opening as main component parts, and a part of the lead material is exposed into the opening of the external case, and the opening of the sensor unit is arranged in the opening of the external case so as to interconnect with the pressure introduction hole, and the lead material and output terminal of the sensor unit are electrically connected in the opening of the external case, and the sensor unit and exposed part of the lead material arranged in the opening of the external case are covered overall or partially with resin injected into the opening of the external case, and the sensor unit and external case are integratedly fixed with the injected resin.

By use of this constitution, the present invention can easily respond to specification changes.

(4) In (1) or (3) mentioned above, it is preferable that the semiconductor sensor of the sensor unit is an absolute pressure sensor having a reference pressure chamber, and the semiconductor sensor for converting the pressure of the sensor unit to an electric signal and the signal processing circuit are composed of one chip, and the electronic part is composed of chip parts such as a capacitor and a resistor, and the external case is composed of thermoplastic resin, and resin to be injected into the opening of the external case is composed of thermoset resin, and the coefficients of linear expansion of the aforementioned thermoplastic resin and thermoset resin are set within the range from 20 to 40 ppm/° C.

(5) In (1) or (3) mentioned above, it is preferable that the output terminal of the sensor unit and the lead material of the external case are electrically connected by welding, and a hollow is formed in the electronic part arrangement portion of the lead material, and a partition or groove for separating the hollows of different lead materials is formed in the external case, and the electrode parts of the electronic parts arranged in the hollows of the lead material are electrically connected with a junction member.

(6) In (5) mentioned above, it is preferable that the welding electrode arrangement area between the lead material of the external case and the output terminal of the sensor unit and the electronic part arrangement area are separated from each other without coexisting.

(7) In (1) or (3) mentioned above, it is preferable that at least three lead materials are used and when the electronic part is arranged so as to extend across the lead materials, the lead materials to be extended across are bent in a crank shape and embedded in the resin of the external case or the lead materials to be extended across are made thinner, and the electronic part arrangement portion of the lead materials is partially made wider.

(8) In (1) or (3) mentioned above, it is preferable that the neighboring portion of the opposite end to the connector terminal portion of the lead material integratedly formed with the external case is bent almost at right angles and the coaxial portion of the connector terminal in the opening and the two surfaces perpendicular to it are exposed into the opening of the external case.

(9) In (1) or (3) mentioned above, it is preferable that the end face of the opening of the sensor unit and the arrangement surface of the output terminal are different from each other and on at least one part between the contact surface with the end face of the opening of the sensor unit of the external case and the arrangement surface of the lead material electrically joined to the output terminal, an inclined surface is provided.

(10) In (1) or (3) mentioned above, it is preferable that a cover having a fitting part into the sensor unit or a part of the external case which is arranged so as to block the opening of the external case overall or partially is provided and the cover, sensor unit, and external case are integratedly fixed with injected resin.

DESCRIPTION OF THE PREFERRED EMBODIMENTS

The constitution of the pressure detecting apparatus of the first embodiment of the present invention will be explained hereunder by referring to FIGS. 1 and 2.

Figure 1:
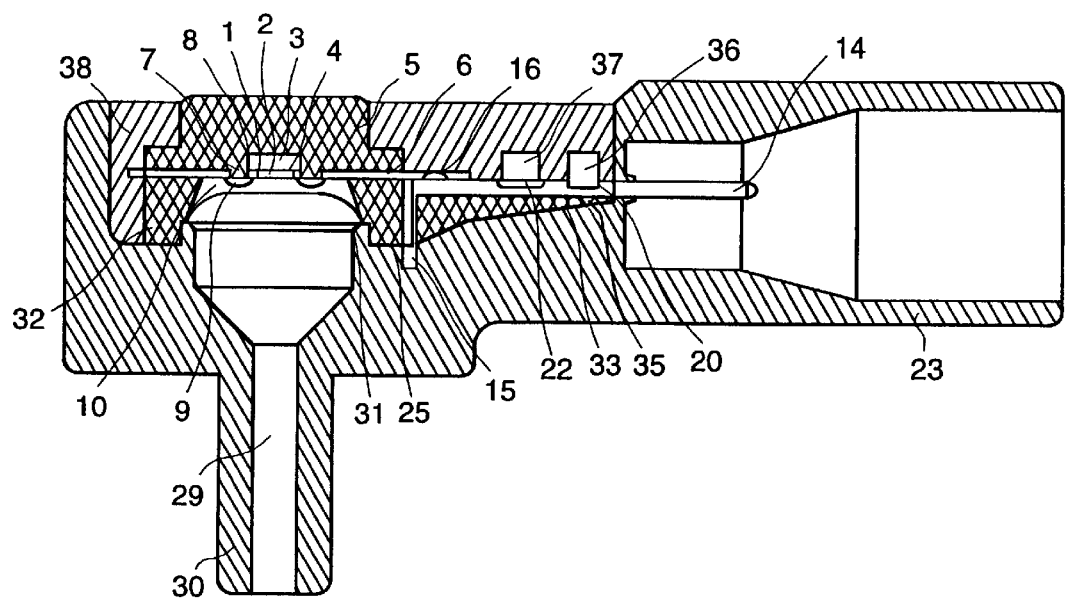
FIG. 1 is a cross sectional view of the pressure detector relating to the first embodiment of the present invention.

FIG. 1 is a cross sectional view of the pressure detecting apparatus of the first embodiment of the present invention. FIG. 2 is a front view of the pressure detecting apparatus of the first embodiment of the present invention.

A semiconductor sensor chip 1 is composed of silicon. A concavity is formed on the lower surface of the center part of the semiconductor sensor chip 1 by etching and a thin diaphragm 2 is formed at the center part. On the upper surface of the diaphragm 2 of the semiconductor sensor chip 1, a pressure detection circuit not shown in the drawing is integratedly formed by the semiconductor process. The pressure detection circuit is composed of four diffused resistors formed on the upper surface of the diaphragm 2 and they are bridged by aluminum conductors.

Further, on the peripheral part of the upper surface of the semiconductor chip 1 except the diaphragm, a characteristic compensation circuit and a protection circuit, which are not shown in the drawing, are integratedly structured by the semiconductor process. The characteristic compensation circuit is composed of a digital-analog mixed circuit for adjusting the relation between pressure and output to a predetermined transfer function. The digital-analog mixed circuit is composed of a digital unit having an EPROM for storing and holding a characteristic adjustment signal and an analog unit for amplifying a signal as main units. The characteristic adjustment signal is used to adjust each characteristic obtained by zero-span adjustment, sensitivity adjustment, and temperature characteristic adjustment. The protection circuit is a circuit installed at the input-output stage connected with the outside for protecting the internal circuit against transient electromagnetic noise for an input-output signal. The pressure detection circuit, characteristic adjustment circuit, and protection circuit are electrically connected respectively with aluminum conductors.

The semiconductor sensor chip 1 is joined to a glass base 3 with Anodic Bonding. The semiconductor sensor chip 1 and the glass base 3 constitute a chip assembly. Between the bottom of the diaphragm 2 of the semiconductor sensor chip 1 and the top of the glass base 3, a reference pressure chamber 4 which is almost evacuated is installed. The linear expansion coefficient of the glass base 3 is structured so as to be almost equal to the linear expansion coefficient of the semiconductor chip 1.

A chip case 5 is composed of thermoset resin such as epoxy resin or thermoplastic resin such as PPS and a terminal 6 is composed of phosphor bronze. The terminal 6 is obtained by pressing a hoop material pre-plated with nickel into shapes and the chip case 5 with a terminal is structured by insert molding using epoxy resin. After the chip case is molded, the terminal is connected in a rectangular shape, though 5 adjustment terminals and 3 input-output terminals are cut off so that the respective terminals become independent. On the bottom of the chip case 5 on the opening side, a concave chip assembly storage unit 7 is installed. The terminal 6 is arranged so that a part thereof is exposed in the periphery of the arrangement portion of the chip assembly and a part thereof is pulled out from the chip case 5.

The chip assembly composed of the semiconductor sensor chip 1 and the glass base 3 is adhered and fixed to the concavity 7 of the chip case 5 with an silicon series adhesive 8. The electrode of the semiconductor sensor chip 1 is wire-bonded to the terminal 6 with a wire 9 composed of gold or aluminum.

The chip assembly composed of the semiconductor sensor chip 1 and the glass base 3 which is arranged on the chip case 5, the aluminum wire 9, and the exposed part of the lead terminal 6 are covered with a silicone gel 10 of phlorosilicon series or fluorine series. The silicone gel 10 prevents transfer of pressure to the semiconductor chip 1 and contact with a corrosive liquid and gas. A sensor unit 11 is structured as mentioned above.

The sensor unit 11 brings a probe into contact with the adjustment terminal and the input-output terminal 12 and electrically communicates with the external pressure adjustment device, thereby adjusts the characteristics of the inner circuit of the semiconductor sensor chip, and then cuts off the parts of the adjustment terminal and the input-output terminal 12 which are projected outside the case to predetermined lengths.

A lead material 13 is composed of brass. The lead material is formed by pressing a hoop material pre-plated with tin. The right side of the lead material on the paper sheet is pressed to a shape of a connector terminal 14 and the left side thereof is pressed to a shape of a terminal 15 bent almost perpendicularly to the connector terminal 14. Further, on the lead material 13, a welding projection 16 is installed at the position where the input-output terminal 12 of the sensor unit 11 is welded. The lead material 13 is composed of a ground terminal 17, an output terminal 18, and a power terminal 19 sequentially from the upper side of the paper sheet of FIG. 2. In the neighborhood of the center between the ground terminal 17 and the output terminal 18, an almost rectangular hollow 20 for arranging the chip capacitor is formed. The depth of the hollow of the lead material is preferably about ⅓ to ½ of the thickness of the lead material 13 and the size of the almost rectangular bottom of the hollow is preferably a size almost equal to the arrangement shape of the chip capacitor electrode. In the same way, an almost rectangular hollow for arranging the chip capacitor must be formed in the ground terminal 17 and the power terminal 19. However, the output terminal 18 lies between both terminals, so that a wide terminal 21 is installed in the neighborhood of the chip capacitor arrangement portion of the ground terminal 17 and the power terminal 19 and a hollow 22 is formed in the neighborhood of the end thereof.

An external case 23 is obtained by insert-molding the lead material 13. The lead material 13 of the external case 23 is fixed to the mold by the two faces of an exposed part 24 in the opening and an exposed part 25 in the perpendicular direction to it at the time of insert molding. Therefore, a lead material fixing pin for injection molding is not required, so that the mold cost can be decreased. Furthermore, the trace of the press pin running from the back of the lead material to the outside of the external case is eliminated, so that the air-tightness of the external case is increased.

The external case 23 is composed of thermoplastic PPS resin. The external case 23 is injected by a predetermined mold, thus a connector coupler 26, a flange 27, an opening 28, a pressure introduction pipe 30 having a pressure introduction hole 29 interconnecting with the opening, and a convex fitting part 31 formed in the opening are installed. Further, an inclined surface 33 for connecting an inner arrangement surface 32 of the opening of the sensor unit 11 and the exposed surface 24 of the lead material on the connector coupler side is installed and on the resin portion between the different lead materials of the exposed part 24 of the lead material, an inclined surface is also installed.

When the opening of the sensor unit 11 is arranged so as to fit into the convex fitting part 29 of the external case 23, the input-output terminal 12 of the sensor unit 11 is overlaid on the welding projection 16 installed on the exposed part 30 of the lead material. By pressing the top of the sensor unit 11, the welding projection 16 of the lead material and the input-output terminal 12 of the sensor unit are electrically joined using projection welding. The lead material of the external case and the sensor unit terminal are welded by supplying a current between the electrode arranged on the welding projection 16 and the electrode arranged in a welding electrode position 34. The loading part of chip capacitors 36 and 37 of the lead material 13 is a different area from the welding current path of the lead material 13 and terminal, so that no failure is generated in tin plating fusion of the lead material of the chip capacitor loading part and resin fusion in the neighborhood of the lead material and the lead material and peripheral resin can load the chip capacitor in a predetermined shape, so that high connection reliability and production yield can be obtained.

In the hollows 20 and 22 formed in the exposed part 24 of the lead material of the external case 23, the chip capacitors 36 and 37 having electrodes at both ends are arranged. The hollows 20 and 22 of the lead material and the chip capacitor arranged part are almost equal rectangles and have a depth of ⅓ to ½ of the thickness of the lead material, so that the chip capacitors 36 and 37 are exactly set in a predetermined position and will not be shifted.

After arrangement of the chip capacitor, the external case 23 is preheated at a predetermined temperature and by pressing the upper part of the chip capacitors 36 and 37, the conductive junction member such as string solder is supplied from obliquely aside the chip capacitors 36 and 37. When a predetermined amount of string solder is supplied in the neighborhood of the electrodes of the chip capacitors 36 and 37 and the lead material 13, the solder is fused by irradiating a laser beam and both members are electrically joined. A material whose fusion temperature is lower than the heat distortion temperature 275° C. of PPS resin constituting the external case 23, for example, tin-silver-copper solder (220° C.) is used, so that the external case 13 will not be damaged.

The inclined surface 33 for connecting the arrangement surface 32 of the sensor unit opening and the arrangement surface of the exposed part of the lead material is installed between the lead materials, so that the resin between the lead materials is also removed in a groove shape. Therefore, the electrically joined member fused between the lead materials and the chip capacitor electrodes will not short between the electrodes of the chip capacitors. Further, when there is another lead material between the arrangement parts of the chip capacitors, the part of the intermediate lead material extending across the chip capacitors is made thinner, and the lead materials on both sides are inversely set in a wider terminal shape 21, and the hollow 22 for loading the chip capacitors are formed in the neighborhood of the ends of the wider parts. Furthermore, the resin between the different terminals is removed in a groove shape in the same way as with the aforementioned, so that the conductive joined member coated on the hollow of the lead material will not short between the electrodes of the chip capacitors and between the electrodes and the lead materials. Further, in this case, instead of making the intermediate lead material thinner, even if the part is bent in a crank shape and embedded in the external case, the same effect is obtained.

The sensor unit 11 and the chip capacitors 36 and 37 are electrically connected to a predetermined position of the lead material 13 of the external case 23, and then by pressing the top 38 of the sensor unit 11, the epoxy resin 35 is injected from the neighborhood of the exposed part 24 of the lead material of the opening 28 of the external case 23, and the resin is set by adding a predetermined temperature, and the sensor unit and external case are fixed strongly.

The inclined surface 33 provided in the opening of the external case 23 functions so as to deliver the injected resin equally around the sensor unit arrangement part. By doing this, the sensor unit can be kept airtight and surely fixed to the external case, so that improvement of reliability and yield can be obtained.

In this case, hydrogen bonding is carried out between epoxy resin and the surface of a covered part, so that the epoxy resin realizes extremely good adhesion. Furthermore, the epoxy resin has good fluidity, so that it can fill up a minute gap generated between an insert lead material and resin when insert parts such as lead materials are integratedly formed using thermoplastic resin and an external case is formed, thus no space is left. Therefore, corrosion and disconnection of the junction due to entering of water or corrosive gas into an electrical junction member such as solder or conductive adhesive can be prevented and a problem of poor air-tightness of the insert terminal which is always imposed in thermoplastic PPS resin can be solved. Therefore, after molding, it is not necessary to coat and set an air-tight seal material such as a silicon adhesive on the connector terminal. Further, in this work, evacuated and deaerated epoxy resin is slowly injected in a vacuum, so that finer filling-up free of bubbles can be carried out, so that further improvement of reliability and yield can be obtained.

In this embodiment, thermoplastic PPS resin constituting the external case 23 and the epoxy resin 35 to be injected in the opening of the external case are almost equal in linear expansion coefficient within the range from 20 to 40 ppm/° C., so that separation of the adhesive interface which is always a problem in adhesion of different kinds of materials is not caused. In the reliability evaluation by the inventors, even if the heat shock durability test of −40° C.←→130° C./hour is executed 2000 cycles, no separation is generated on the adhesive interface, and the electrical connection with the chip capacitors 36 and 37 loaded on the lead material 13 is ensured, and an extremely stable mounting structure is obtained.

Meanwhile, in manufacture of a semiconductor sensor chip by the standard CMOS process, an advantage can be obtained from the viewpoint of manufacture cost, while the bias resistance at the time of application of a transient excessive voltage such as static electricity and surge is generally inferior to that by another process such as the bipolar process and an advise is made for increasing the resistance by a combination with a high breakdown voltage DMOS. Further, for insurance of the failure resistance by radio waves, a countermeasure is taken by the protective circuit arranged in one chip. However, when the request level of customers and the industrial field for these disturbances is increased and the existing protective element in one chip cannot respond, re-development and re-design of a chip are necessary and a great cost and a long period are required.

On the other hand, this embodiment is structured so as to load a chip capacitor for improving the transient voltage resistance and failure resistance by radio waves in the input-output terminal beforehand, so that the embodiment is structured so as to fully compensate for the flexibility of the chip resistance which is a disadvantage for use of a 1-chip semiconductor sensor and the development expenses and period can be reduced.

Furthermore, this embodiment does not require parts such as a cover for the opening 28 of the external case 23, so that the embodiment has a mounting structure for greatly contributing to miniaturization of the external case due to abolition of the fitting space between both members and cost reduction due to reduction in the manufacture man-hour.

As explained above, according to this embodiment, a pressure detector that the sensor unit for detecting pressure and an electronic part for reducing electrical disturbance are electrically joined to the lead material of the opening of the external case, and thermoset resin is injected and set in the aforementioned opening, thus the aforementioned members are fixed to each other can be obtained, so that even if the single 1-chip semiconductor sensor may not satisfy the transient voltage resistance and electromagnetic failure resistance, an external electronic part whose performance is compensated for by a method which is inexpensive and has high connection reliability can be mounted and the cost can be reduced by miniaturization, light in weight, and reduction in the assembly man-hour. Therefore, at the time of changing the specification, the embodiment can easily respond to it.

Next, the constitution of the pressure detector of the second embodiment of the present invention will be explained by referring to FIG. 3.

Figure 2:
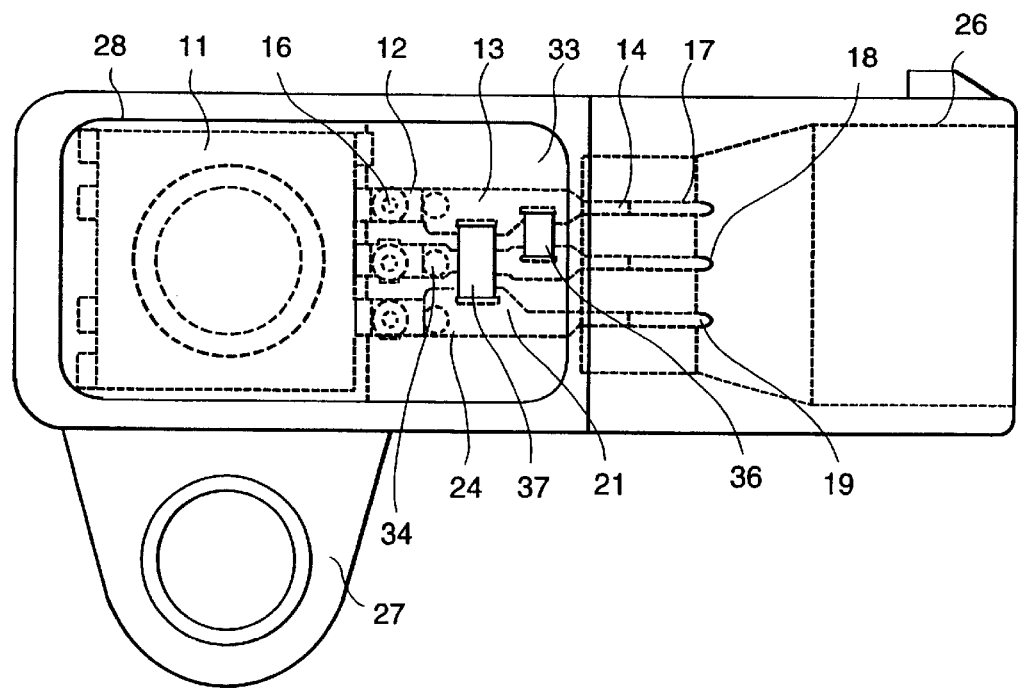
FIG. 2 is a front view of the pressure detector relating to the first embodiment of the present invention.
Figure 3:
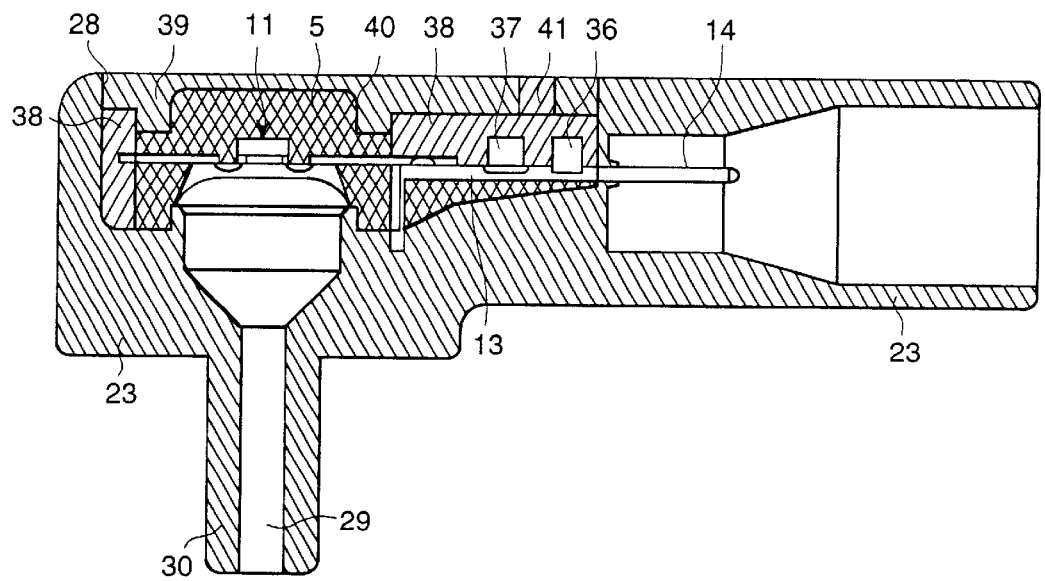
FIG. 3 is a cross sectional view of the pressure detector relating to the second embodiment of the present invention.

FIG. 3 is a cross-sectional view of the pressure detector of the second embodiment of the present invention. The same numerals shown in FIGS. 1 and 2 indicate the same parts.

A cover 39 for the opening 28 of the external case 23 has a fitting part 40 into the upper part of the sensor unit 11 and a resin injection hole 41. The sensor unit 11 and the chip capacitors 36 and 37 are electrically joined to the lead material 13, and then the cover 39 is fit into the sensor unit 11, and by pressing the upper part of the cover 39, epoxy resin 38 is injected from the resin injection hole 41. The epoxy resin 38 is injected until the resin injection hole 41 of the cover 39 is stopped up and the cover 39, the sensor unit 11, and the external case 23 are simultaneously fixed by adding a predetermined temperature.

As explained above, according to this embodiment, the cover 39 is fit into the sensor unit 11 so as to cover and enclose the outer periphery of the chip case 5, so that the chip case can be isolated from the effect of the shrinkage stress due to injection and setting of the epoxy resin. Therefore, even if the sensor unit 11 is under a specification for main use of minute pressure detection, a stable pressure detector can be obtained.

Further, in the same way as with the embodiment shown in FIGS. 1 and 2, at the time of changing the specification, the embodiment can easily respond to it.

Next, the constitution of the pressure detector of the third embodiment of the present invention will be explained by referring to FIG. 4.

Figure 4:
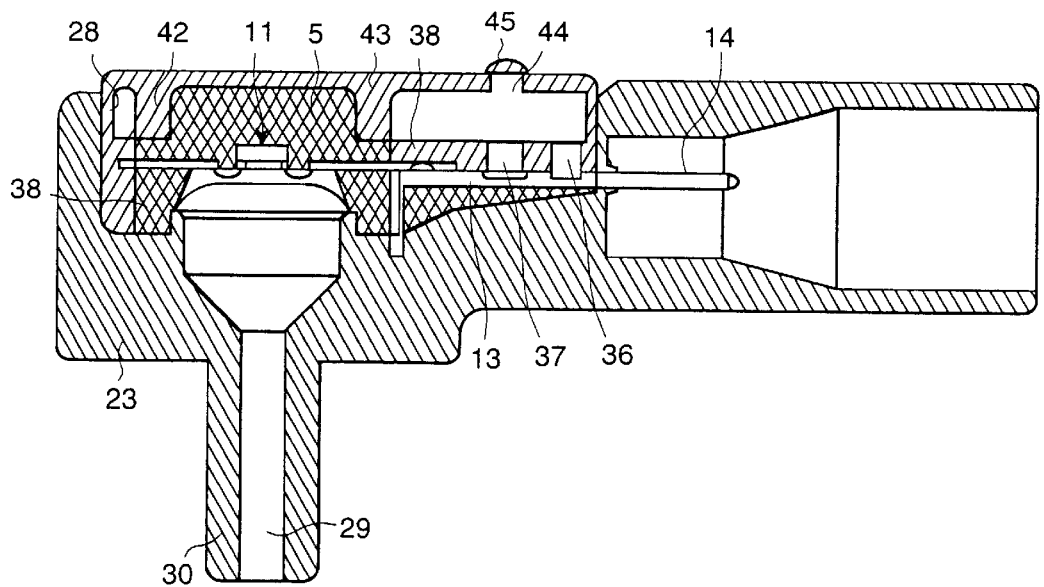
FIG. 4 is a cross sectional view of the pressure detector relating to the third embodiment of the present invention.

FIG. 4 is a cross sectional view of the pressure detector of the third embodiment of the present invention. The same numerals as those shown in FIGS. 1, 2, and 3 indicate the same parts.

A cover 42 for the opening 38 of the external case 23 has a fitting part 43 into the upper part of the sensor unit 11 and a resin injection hole 44. The sensor unit 11 and the chip capacitors 36 and 37 are electrically joined to the lead material 13, and then the cover 42 is fit into the sensor unit 11, and by pressing the upper part of the cover 42, the epoxy resin 38 is injected from the resin injection hole 44. The epoxy resin 38 is injected until the chip capacitors 36 and 37 are covered with resin and the peripheral part of the cover 42 inserted in the opening of the external case 23 is filled up with a predetermined amount of injected resin and the cover 42, the sensor unit 11, and the external case 23 are simultaneously fixed by adding a predetermined temperature. Next, projected resin around the resin injection hole 44 which is not shown in the drawing is fused by heat caulking so as to form a cap 45 and the opening 28 of the external case 23 is interrupted from the outside.

According to this embodiment, only a part of the lower part of the external case 23 on the opening surface side of the sensor unit 11 is fixed by the epoxy resin 38, so that the chip case side where the semiconductor sensor chip 1 is arranged can be structured so as to be more hardly affected by the epoxy resin, thus a stabler pressure detector can be obtained.

Further, in the same way as with the embodiments shown in FIGS. 1 to 3, at the time of changing the specification, the embodiment can easily respond to it.

Next, the constitution of the pressure detector of the fourth embodiment of the present invention will be explained by referring to FIG. 5.

Figure 5:
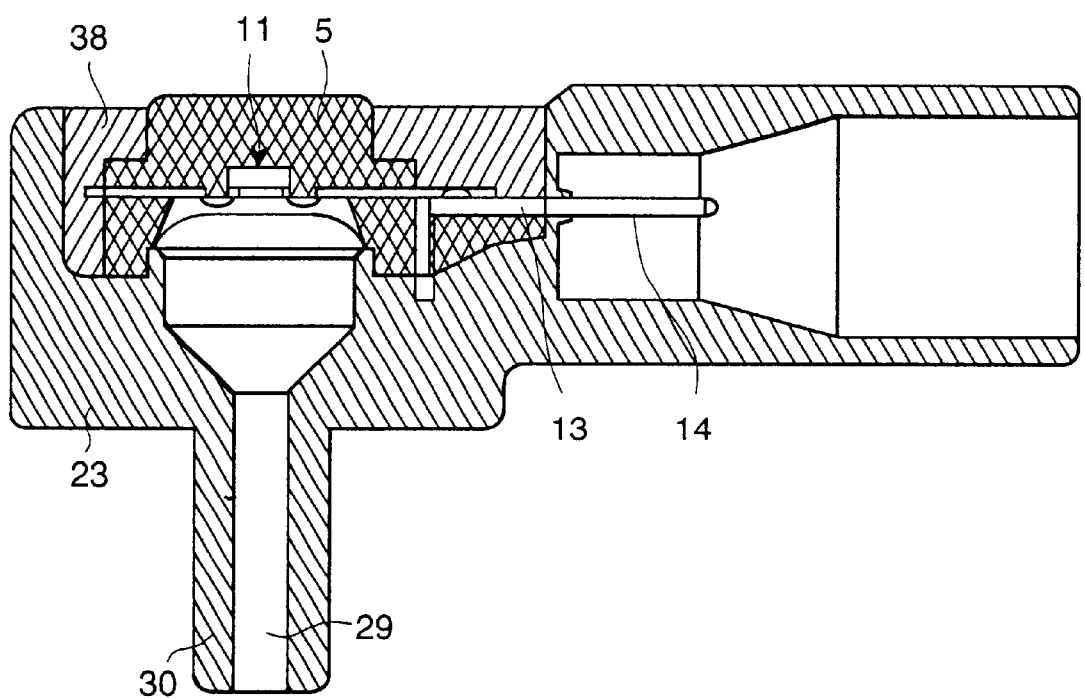
FIG. 5 is a cross sectional view of the pressure detector relating to the fourth embodiment of the present invention.

FIG. 5 is a cross sectional view of the pressure detector of the fourth embodiment of the present invention. The same numerals as those shown in FIGS. 1 to 4 indicate the same parts.

In this embodiment, compared with FIG. 1, the chip capacitors 36 and 37 shown in FIG. 1 are omitted. Namely, when the performance of the semiconductor sensor chip satisfies the customer required specification, it is not always necessary to arrange the capacitors 36 and 37 on the lead material 13 and the capacitors can be abolished.

In this embodiment, the external case can be miniaturized more and lightweight, reduction in the assembly man-hour, and reduction in the number of parts can be realized.

The present invention, at the time of changing the specification, can easily respond to it.

What we claim is:

1. A pressure detector, comprising:
   a lead material partially having a connector terminal for electrical connection with an outside,
   an external case partially having an opening which is formed integratedly with said lead material,
   a sensor unit including a semiconductor sensor for converting pressure to an electric signal, a signal processing circuit, an output terminal for outputting a processed signal, and a chip case having an opening, and
   an electronic part for reducing electric disturbance,
   wherein a part of said lead material is exposed into said opening of said external case,
   wherein said sensor unit and said electronic part are arranged in said opening of said external case,
   wherein said lead material, said electronic part, and said terminal of said sensor unit are electrically connected in said opening of said external case, and
   wherein said electronic part is joined to said lead material through a conductive joined member.

2. A pressure detector, comprising:
   a lead material partially having a connector terminal for electrical connection with an outside,
   an external case partially having an opening which is formed integratedly with said lead material,
   a sensor unit including a semiconductor sensor for converting pressure to an electric signal, a signal processing circuit, an output terminal for outputting a processed signal, and a chip case having an opening, and
   an electronic part for reducing electric disturbance,
   wherein a part of said lead material is exposed into said opening of said external case,
   wherein said sensor unit and said electronic part are arranged in said opening of said external case,
   wherein said lead material, said electronic part, and said terminal of said sensor unit are electrically connected in said opening of said external case, and
   wherein a pressure introduction pipe is formed integrally with the external case and, at a side opposed to a side to which said pressure introduction pipe is provided, resin is injected into the opening of the external case.

3. A pressure detector, comprising:
   a lead material partially having a connector terminal for electrical connection with an outside,
   an external case partially having an opening which is formed integratedly with said lead material,
   a sensor unit including a semiconductor sensor for converting pressure to an electric signal, a signal processing circuit, an output terminal for outputting a processed signal, and a chip case having an opening, and
   an electronic part for reducing electric disturbance,
   wherein a part of said lead material is exposed into said opening of said external case,
   wherein said sensor unit and said electronic part are arranged in said opening of said external case,
   wherein said lead material, said electronic part, and said terminal of said sensor unit are electrically connected in said opening of said external case, and
   wherein a sensor chip, a terminal of said sensor chip, and said lead material are installed in a direction of a connector so as to be received within a width of said connector.

4. A pressure detector comprising:
   a lead material partially having a connector terminal for electrical connection with an outside,
   an external case partially having an opening and a pressure introduction hole interconnecting with said opening which is formed integratedly with said lead material, and
   a sensor unit including a semiconductor sensor for converting pressure to an electric signal, a signal processing circuit, an output terminal for outputting a processed signal, and a chip case having an opening,
   wherein a part of said lead material is exposed into said opening of said external case,
   wherein said opening of said sensor unit is arranged in said opening of said external case so as to interconnect with said pressure introduction hole,
   wherein said lead material and said output terminal of said sensor unit are electrically connected in said opening of said external case,
   wherein said sensor unit and said exposed part of said lead material are covered at least partially with resin injected into said opening of said external case and said sensor unit and said external case are integratedly fixed with said injected resin, and
   wherein an electronic part is joined to said lead material through a conductive joined member.

5. A pressure detector comprising:
   a lead material partially having a connector terminal for electrical connection with an outside,
   an external case partially having an opening and a pressure introduction pipe with a pressure introduction hole interconnecting with said opening which is formed integratedly with said lead material, and
   a sensor unit including a semiconductor sensor for converting pressure to an electric signal, a signal processing circuit, an output terminal for outputting a processed signal, and a chip case having an opening,
   wherein a part of said lead material is exposed into said opening of said external case,
   wherein said opening of said sensor unit is arranged in said opening of said external case so as to interconnect with said pressure introduction hole,
   wherein said lead material and said output terminal of said sensor unit are electrically connected in said opening of said external case,
   wherein said sensor unit and said exposed part of said lead material are covered at least partially with resin injected into said opening of said external case and said sensor unit and said external case are integratedly fixed with said injected resin, and
   wherein said pressure introduction pipe is formed integrally with the external case and, at a side opposed to a side to which said pressure introduction pipe is provided, resin is injected into the opening of the external case.

6. A pressure detector comprising:
   a lead material partially having a connector terminal for electrical connection with an outside,
   an external case partially having an opening and a pressure introduction hole interconnecting with said opening which is formed integratedly with said lead material, and
   a sensor unit including a semiconductor sensor for converting pressure to an electric signal, a signal processing circuit, an output terminal for outputting a processed signal, and a chip case having an opening, wherein a part of said lead material is exposed into said opening of said external case, wherein said opening of said sensor unit is arranged in said opening of said external case so as to interconnect with said pressure introduction hole, wherein said lead material and said output terminal of said sensor unit are electrically connected in said opening of said external case, wherein said sensor unit and said exposed part of said lead material are covered at least partially with resin injected into said opening of said external case and said sensor unit and said external case are integratedly fixed with said injected resin, and wherein a sensor chip, a terminal of said sensor chip, and said lead material are installed in a direction of a connector so as to be received within a width of said connector.

7. A pressure detector according to claim 1, 2, or 3, wherein:

said external case is provided with a pressure introduction hole interconnecting with said opening of said external case, said opening of said sensor unit and said opening of said external case are respectively provided with fitting parts, said sensor unit and said external case are fit into each other so that said semiconductor sensor of said sensor unit and an air introduction hole of said external case are interconnected with each other, said sensor unit, said electronic part, and said exposed part of said lead material which are arranged in said opening of said external case are covered overall or partially with resin injected into said opening of said external case and integratedly fixed with injected resin, and said fitting parts of said sensor unit and said external case are sealed airtightly.

8. A pressure detector according to claim 1, 2, 3, or 4, wherein:

said semiconductor sensor of said sensor unit is an absolute pressure sensor having a reference pressure chamber, said semiconductor sensor for converting pressure to an electric signal and said signal processing circuit are composed of one chip, said electronic part is composed of chip parts such as a capacitor and a resistor, said external case is composed of thermoplastic resin, said resin to be injected into said opening of said external case is composed of thermoset resin, and coefficients of linear expansion of said thermoplastic resin and said thermoset resin are set within a range from 20 to 40 ppm/° C.

9. A pressure detector according to claim 1, 2, 3, or 4, wherein:

said output terminal of said sensor unit and said lead material are electrically connected by welding, a hollow is formed in an electronic part arrangement portion of said lead material, a partition or groove for separating hollows of different lead materials is formed in said external case, and an electrode of said electronic part is arranged in said hollow and is electrically connected with a junction member.

10. A pressure detector according to claim 9, wherein:

a welding electrode arrangement area between said lead material and said output terminal and said electronic part arrangement portion are separated from each other without coexisting.

11. A pressure detector according to claim 1, 2, 3, or 4, wherein:

at least three lead materials are used, and when said electronic part is arranged so as to extend across said lead materials, said lead materials are bent in a crank shape and embedded in said resin of said external case or said lead materials are made thinner and an electronic part arrangement portion of said lead materials is partially made wider.

12. A pressure detector according to claim 1, 2, 3, 4, 5, or 6, wherein:

a neighboring portion of an opposite end to said connector terminal of said lead material is integratedly formed with said external case and is bent almost at right angles, and a coaxial portion of said connector terminal and two surfaces perpendicular to said coaxial portion are exposed into said opening of said external case.

13. A pressure detector according to claim 1, 2, 3, 4, 5, or 6, wherein an inclined surface is provided on at least one part of said external case and an arrangement surface of said lead material which is electrically joined to said output terminal.

14. A pressure detector according to claim 1, 2, 3, 4, 5, or 6, and further comprising a cover having a fitting part which fits into said sensor unit or a part of said external case, wherein said cover, said sensor unit, and said external case are integratedly fixed with said injected resin.

* * * * *